(12) United States Patent
Chandrashekar et al.

(10) Patent No.: US 11,978,666 B2
(45) Date of Patent: May 7, 2024

(54) VOID FREE LOW STRESS FILL

(71) Applicant: Lam Research Corporation, Fremont, CA (US)

(72) Inventors: Anand Chandrashekar, Fremont, CA (US); Tsung-Han Yang, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 420 days.

(21) Appl. No.: 17/299,753

(22) PCT Filed: Dec. 5, 2019

(86) PCT No.: PCT/US2019/064768
§ 371 (c)(1),
(2) Date: Jun. 3, 2021

(87) PCT Pub. No.: WO2020/118100
PCT Pub. Date: Jun. 11, 2020

(65) Prior Publication Data
US 2022/0020641 A1    Jan. 20, 2022

Related U.S. Application Data

(60) Provisional application No. 62/775,772, filed on Dec. 5, 2018.

(51) Int. Cl.
*H01L 21/768* (2006.01)
*C23C 16/04* (2006.01)
(Continued)

(52) U.S. Cl.
CPC ........ *H01L 21/76879* (2013.01); *C23C 16/04* (2013.01); *C23C 16/06* (2013.01);
(Continued)

(58) Field of Classification Search
None
See application file for complete search history.

(56) References Cited

U.S. PATENT DOCUMENTS

| 4,714,520 A | 12/1987 | Gwozdz |
| 4,746,375 A | 5/1988 | Iacovangelo |

(Continued)

FOREIGN PATENT DOCUMENTS

| CN | 1798867 A | 7/2006 |
| CN | 1883037 A | 12/2006 |

(Continued)

OTHER PUBLICATIONS

U.S. Office Action dated Sep. 3, 2015 issued in U.S. Appl. No. 14/465,610.
(Continued)

*Primary Examiner* — Feifei Yeung Lopez
(74) *Attorney, Agent, or Firm* — Weaver Austin Villeneuve & Sampson LLP

(57) ABSTRACT

Provided herein are methods of depositing low stress and void free metal films in deep features and related apparatus. Embodiments of the methods include treating the sidewalls of the holes to inhibit metal deposition while leaving the feature bottom untreated. In subsequent deposition operations, metal precursor molecules diffuse to the feature bottom for deposition. The process is repeated with subsequent inhibition operations treating the remaining exposed sidewalls. By repeating inhibition and deposition operations, high quality void free fill can be achieved. This allows high temperature, low stress deposition to be performed.

20 Claims, 5 Drawing Sheets

(51) Int. Cl.
*C23C 16/06* (2006.01)
*C23C 16/455* (2006.01)
*C23C 16/52* (2006.01)
*H01J 37/32* (2006.01)
*H01L 21/285* (2006.01)
*H10B 69/00* (2023.01)

(52) U.S. Cl.
CPC ........ *C23C 16/45534* (2013.01); *C23C 16/52* (2013.01); *H01J 37/32449* (2013.01); *H01J 37/32715* (2013.01); *H01L 21/76843* (2013.01); *H01L 21/76856* (2013.01); *H01L 21/28568* (2013.01); *H10B 69/00* (2023.02)

(56) References Cited

U.S. PATENT DOCUMENTS

| | | |
|---|---|---|
| 5,112,439 A | 5/1992 | Reisman et al. |
| 5,250,467 A | 10/1993 | Somekh et al. |
| 5,370,739 A | 12/1994 | Foster et al. |
| 5,391,394 A | 2/1995 | Hansen |
| 5,407,698 A | 4/1995 | Emesh |
| 5,489,552 A | 2/1996 | Merchant et al. |
| 5,504,038 A | 4/1996 | Chien et al. |
| 5,719,410 A | 2/1998 | Suehiro et al. |
| 5,785,796 A | 7/1998 | Lee |
| 5,804,249 A | 9/1998 | Sukharev et al. |
| 5,866,483 A | 2/1999 | Shiau et al. |
| 5,963,827 A | 10/1999 | Enomoto et al. |
| 5,963,833 A | 10/1999 | Thakur |
| 6,001,729 A | 12/1999 | Shinriki et al. |
| 6,013,575 A | 1/2000 | Itoh |
| 6,017,818 A | 1/2000 | Lu |
| 6,025,243 A | 2/2000 | Ohmi et al. |
| 6,034,419 A | 3/2000 | Nicholls et al. |
| 6,037,263 A | 3/2000 | Chang |
| 6,066,366 A | 5/2000 | Berenbaum et al. |
| 6,100,193 A | 8/2000 | Suehiro et al. |
| 6,107,200 A | 8/2000 | Takagi et al. |
| 6,143,082 A | 11/2000 | McInerney et al. |
| 6,184,158 B1 | 2/2001 | Shufflebotham et al. |
| 6,245,654 B1 | 6/2001 | Shih et al. |
| 6,339,023 B1 | 1/2002 | Kitazaki et al. |
| 6,355,558 B1 | 3/2002 | Dixit et al. |
| 6,432,830 B1 | 8/2002 | Merry |
| 6,503,843 B1 | 1/2003 | Xia et al. |
| 6,566,250 B1 | 5/2003 | Tu et al. |
| 6,696,337 B2 | 2/2004 | Asano et al. |
| 6,790,773 B1 | 9/2004 | Drewery et al. |
| 6,861,356 B2 | 3/2005 | Matsuse et al. |
| 6,902,763 B1 | 6/2005 | Elers et al. |
| 6,903,016 B2 | 6/2005 | Cohen |
| 7,005,372 B2 | 2/2006 | Levy et al. |
| 7,141,494 B2 | 11/2006 | Lee et al. |
| 7,355,254 B2 | 4/2008 | Datta et al. |
| 7,501,343 B2 | 3/2009 | Byun et al. |
| 7,501,344 B2 | 3/2009 | Byun et al. |
| 7,569,913 B2 | 8/2009 | Enicks |
| 7,655,567 B1 | 2/2010 | Gao et al. |
| 7,691,749 B2 | 4/2010 | Levy et al. |
| 8,119,527 B1 | 2/2012 | Chandrashekar et al. |
| 8,124,531 B2 | 2/2012 | Chandrashekar et al. |
| 8,129,270 B1 | 3/2012 | Chandrashekar et al. |
| 8,258,057 B2 | 9/2012 | Kuhn et al. |
| 8,409,985 B2 | 4/2013 | Chan et al. |
| 8,435,894 B2 | 5/2013 | Chandrashekar et al. |
| 8,551,885 B2 | 10/2013 | Chen et al. |
| 8,835,317 B2 | 9/2014 | Chandrashekar et al. |
| 8,853,080 B2 | 10/2014 | Guan et al. |
| 8,975,184 B2 | 3/2015 | Chen et al. |
| 9,034,768 B2 | 5/2015 | Chandrashekar et al. |
| 9,165,824 B2 | 10/2015 | Chandhok et al. |
| 9,240,347 B2 | 1/2016 | Chandrashekar et al. |
| 9,349,637 B2 | 5/2016 | Na et al. |
| 9,653,353 B2 | 5/2017 | Chandrashekar et al. |
| 9,748,137 B2 | 8/2017 | Lai et al. |
| 9,997,405 B2 | 6/2018 | Chandrashekar et al. |
| 10,103,058 B2 | 10/2018 | Chandrashekar et al. |
| 10,170,320 B2 | 1/2019 | Wang et al. |
| 10,193,059 B2 | 1/2019 | Lee et al. |
| 10,211,099 B2 | 2/2019 | Wang et al. |
| 10,242,879 B2 | 3/2019 | Na et al. |
| 10,256,142 B2 | 4/2019 | Chandrashekar et al. |
| 10,381,266 B2 | 8/2019 | Yang et al. |
| 10,573,522 B2 | 2/2020 | Jandl et al. |
| 10,580,654 B2 | 3/2020 | Wang et al. |
| 10,580,695 B2 | 3/2020 | Chandrashekar et al. |
| 10,916,434 B2 | 2/2021 | Wang et al. |
| 11,075,115 B2 | 7/2021 | Chandrashekar et al. |
| 11,355,345 B2 | 6/2022 | Jandl et al. |
| 11,410,883 B2 | 8/2022 | Chandrashekar et al. |
| 11,437,269 B2 | 9/2022 | Yang et al. |
| 2001/0044041 A1 | 11/2001 | Badding et al. |
| 2002/0037630 A1 | 3/2002 | Agarwal et al. |
| 2002/0090811 A1 | 7/2002 | Kim et al. |
| 2002/0132472 A1 | 9/2002 | Park |
| 2002/0155722 A1 | 10/2002 | Satta et al. |
| 2002/0177316 A1 | 11/2002 | Miller et al. |
| 2002/0192953 A1 | 12/2002 | Wang et al. |
| 2003/0082902 A1 | 5/2003 | Fukui et al. |
| 2003/0091870 A1 | 5/2003 | Bhowmik et al. |
| 2003/0129828 A1 | 7/2003 | Cohen et al. |
| 2003/0190802 A1 | 10/2003 | Wang et al. |
| 2003/0194850 A1 | 10/2003 | Lewis et al. |
| 2003/0203123 A1 | 10/2003 | Shang et al. |
| 2003/0222346 A1 | 12/2003 | Yun et al. |
| 2004/0079632 A1 | 4/2004 | Ahmad et al. |
| 2004/0142557 A1 | 7/2004 | Levy et al. |
| 2004/0149386 A1 | 8/2004 | Numasawa et al. |
| 2004/0206267 A1 | 10/2004 | Sambasivan et al. |
| 2004/0245091 A1 | 12/2004 | Karim et al. |
| 2005/0014365 A1 | 1/2005 | Moon et al. |
| 2005/0031786 A1 | 2/2005 | Lee et al. |
| 2005/0059236 A1 | 3/2005 | Nishida et al. |
| 2005/0147762 A1 | 7/2005 | Dubin et al. |
| 2005/0179141 A1 | 8/2005 | Yun et al. |
| 2006/0009034 A1 | 1/2006 | Lai et al. |
| 2006/0075966 A1 | 4/2006 | Chen et al. |
| 2006/0094238 A1 | 5/2006 | Levy et al. |
| 2006/0145190 A1 | 7/2006 | Salzman et al. |
| 2006/0265100 A1 | 11/2006 | Li |
| 2007/0066060 A1 | 3/2007 | Wang |
| 2007/0099420 A1 | 5/2007 | Dominguez et al. |
| 2007/0166989 A1 | 7/2007 | Fresco et al. |
| 2007/0199922 A1 | 8/2007 | Shen et al. |
| 2007/0264105 A1 | 11/2007 | Pharand et al. |
| 2008/0054468 A1 | 3/2008 | Choi et al. |
| 2008/0081470 A1 | 4/2008 | Clark |
| 2008/0254623 A1 | 10/2008 | Chan et al. |
| 2009/0045517 A1 | 2/2009 | Sugiura et al. |
| 2009/0053426 A1 | 2/2009 | Lu et al. |
| 2009/0053893 A1 | 2/2009 | Khandelwal et al. |
| 2009/0149022 A1 | 6/2009 | Chan et al. |
| 2009/0160030 A1 | 6/2009 | Tuttle |
| 2009/0163025 A1 | 6/2009 | Humayun et al. |
| 2009/0183984 A1 | 7/2009 | Sakuma et al. |
| 2009/0315154 A1 | 12/2009 | Kirby et al. |
| 2010/0055904 A1 | 3/2010 | Chen et al. |
| 2010/0072623 A1 | 3/2010 | Prindle et al. |
| 2010/0130002 A1 | 5/2010 | Dao et al. |
| 2010/0144140 A1 | 6/2010 | Chandrashekar et al. |
| 2010/0159694 A1 | 6/2010 | Chandrashekar et al. |
| 2010/0167527 A1 | 7/2010 | Wu et al. |
| 2010/0267230 A1 | 10/2010 | Chandrashekar et al. |
| 2010/0267235 A1* | 10/2010 | Chen ................ H01L 21/76876 257/E21.295 |
| 2011/0045672 A1 | 2/2011 | Srinivasan et al. |
| 2011/0111533 A1 | 5/2011 | Varadarajan et al. |
| 2011/0151670 A1 | 6/2011 | Lee et al. |
| 2011/0159690 A1 | 6/2011 | Chandrashekar et al. |
| 2011/0223763 A1 | 9/2011 | Chan et al. |
| 2011/0233778 A1 | 9/2011 | Lee et al. |
| 2011/0236594 A1 | 9/2011 | Haverkamp et al. |
| 2012/0009785 A1 | 1/2012 | Chandrashekar et al. |

(56) References Cited

U.S. PATENT DOCUMENTS

| | | | |
|---|---|---|---|
| 2012/0077342 A1 | 3/2012 | Gao et al. |
| 2012/0115329 A1 | 5/2012 | Chandrashekar et al. |
| 2012/0149213 A1 | 6/2012 | Nittala et al. |
| 2012/0177845 A1 | 7/2012 | Odedra et al. |
| 2012/0187305 A1 | 7/2012 | Elam et al. |
| 2012/0294874 A1 | 11/2012 | Macary et al. |
| 2013/0062677 A1 | 3/2013 | Li et al. |
| 2013/0171822 A1 | 7/2013 | Chandrashekar et al. |
| 2013/0260555 A1 | 10/2013 | Zope et al. |
| 2013/0302980 A1 | 11/2013 | Chandrashekar et al. |
| 2013/0330926 A1 | 12/2013 | Chandrashekar et al. |
| 2014/0030889 A1 | 1/2014 | Chen et al. |
| 2014/0073135 A1 | 3/2014 | Guan et al. |
| 2014/0106083 A1 | 4/2014 | Wu et al. |
| 2014/0120723 A1 | 5/2014 | Fu et al. |
| 2014/0231896 A1 | 8/2014 | Matsumori et al. |
| 2014/0264932 A1 | 9/2014 | Ting et al. |
| 2014/0349477 A1 | 11/2014 | Chandrashekar et al. |
| 2015/0024592 A1 | 1/2015 | Chandrashekar et al. |
| 2015/0056803 A1 | 2/2015 | Chandrashekar et al. |
| 2015/0091175 A1 | 4/2015 | Chandhok et al. |
| 2015/0093890 A1 | 4/2015 | Blackwell et al. |
| 2015/0162214 A1 | 6/2015 | Thompson et al. |
| 2015/0294906 A1 | 10/2015 | Wu et al. |
| 2015/0361547 A1 | 12/2015 | Lin et al. |
| 2016/0020169 A1 | 1/2016 | Matsuda |
| 2016/0056074 A1 | 2/2016 | Na et al. |
| 2016/0056077 A1 | 2/2016 | Lai et al. |
| 2016/0093528 A1* | 3/2016 | Chandrashekar ....... C23C 16/50 438/666 |
| 2016/0172211 A1 | 6/2016 | Demos et al. |
| 2016/0190008 A1 | 6/2016 | Chandrashekar et al. |
| 2016/0293467 A1 | 10/2016 | Caveney et al. |
| 2016/0343612 A1 | 11/2016 | Wang et al. |
| 2017/0125548 A1 | 5/2017 | Hung et al. |
| 2017/0229341 A1 | 8/2017 | Chang et al. |
| 2017/0278749 A1 | 9/2017 | Chandrashekar et al. |
| 2017/0365513 A1 | 12/2017 | Yang et al. |
| 2018/0053660 A1 | 2/2018 | Jandl et al. |
| 2018/0174901 A1 | 6/2018 | Wang et al. |
| 2018/0277431 A1 | 9/2018 | Chandrashekar et al. |
| 2018/0308701 A1 | 10/2018 | Na et al. |
| 2019/0019725 A1 | 1/2019 | Chandrashekar et al. |
| 2019/0080914 A1 | 3/2019 | Wang et al. |
| 2019/0206731 A1 | 7/2019 | Chandrashekar et al. |
| 2019/0326168 A1 | 10/2019 | Yang et al. |
| 2020/0144066 A1 | 5/2020 | Jandl et al. |
| 2020/0185225 A1 | 6/2020 | Wang et al. |
| 2020/0185273 A1 | 6/2020 | Chandrashekar et al. |
| 2021/0327754 A1 | 10/2021 | Chandrashekar et al. |
| 2022/0102208 A1 | 3/2022 | Chandrashekar et al. |
| 2022/0359280 A1 | 11/2022 | Yang et al. |
| 2023/0041794 A1 | 2/2023 | Chandrashekar et al. |
| 2023/0122846 A1 | 4/2023 | Khare et al. |
| 2023/0130557 A1 | 4/2023 | Birru et al. |

FOREIGN PATENT DOCUMENTS

| | | |
|---|---|---|
| CN | 101154576 A | 4/2008 |
| CN | 101213320 A | 7/2008 |
| CN | 101308794 A | 11/2008 |
| CN | 101313085 A | 11/2008 |
| CN | 101447427 A | 6/2009 |
| CN | 101770978 A | 7/2010 |
| CN | 101789369 A | 7/2010 |
| CN | 101899649 A | 12/2010 |
| CN | 102007573 A | 4/2011 |
| CN | 102074500 A | 5/2011 |
| CN | 102224574 A | 10/2011 |
| CN | 102574884 A | 7/2012 |
| CN | 102892922 A | 1/2013 |
| CN | 103107120 A | 5/2013 |
| CN | 103125013 A | 5/2013 |
| CN | 104081502 A | 10/2014 |
| CN | 104272440 A | 1/2015 |
| CN | 104513973 A | 4/2015 |
| CN | 104752339 A | 7/2015 |
| CN | 104975268 A | 10/2015 |
| CN | 105390438 A | 3/2016 |
| CN | 105405764 A | 3/2016 |
| CN | 106169440 A | 11/2016 |
| CN | 107768304 A | 3/2018 |
| CN | 110004429 B | 8/2021 |
| EP | 0430303 A2 | 6/1991 |
| EP | 1672687 A1 | 6/2006 |
| EP | 2779224 A2 | 9/2014 |
| JP | H0225568 A | 1/1990 |
| JP | H2-187031 A | 7/1990 |
| JP | H03110840 A | 5/1991 |
| JP | H4-142061 A | 5/1992 |
| JP | H5-226280 A | 9/1993 |
| JP | H07-094488 | 4/1995 |
| JP | H7-147321 A | 6/1995 |
| JP | H07-226393 | 8/1995 |
| JP | 09-022896 A | 1/1997 |
| JP | 2002-016066 A | 1/2002 |
| JP | 2003022985 A | 1/2003 |
| JP | 2007-251164 | 9/2007 |
| JP | 2008-177577 | 7/2008 |
| JP | 2009024252 A | 2/2009 |
| JP | 2010-251760 A | 11/2010 |
| JP | 2010541252 A | 12/2010 |
| JP | 2011-035366 A | 2/2011 |
| JP | 2011-199021 A | 10/2011 |
| JP | 2011228709 A | 11/2011 |
| JP | 2015514160 A | 5/2015 |
| JP | 2016025141 A | 2/2016 |
| JP | 2014183185 A | 3/2020 |
| KR | 10-1998-0011846 A | 5/1998 |
| KR | 10-2001-0030488 | 4/2001 |
| KR | 2001-0048302 | 6/2001 |
| KR | 20030092583 A | 12/2003 |
| KR | 20050008320 A | 1/2005 |
| KR | 10-2005-0087428 A | 8/2005 |
| KR | 10-2006-0087844 | 8/2006 |
| KR | 10-2007-0054100 | 5/2007 |
| KR | 10-0757418 B1 | 9/2007 |
| KR | 10-2008-0001460 A | 1/2008 |
| KR | 10-2008-0061978 A | 7/2008 |
| KR | 2008-0094088 | 10/2008 |
| KR | 2009-0068187 | 6/2009 |
| KR | 10-2009-0074560 A | 7/2009 |
| KR | 10-2010-0067065 | 6/2010 |
| KR | 20100114856 A | 10/2010 |
| KR | 20110052436 A | 5/2011 |
| KR | 10-2011-0108382 A | 10/2011 |
| KR | 20120005992 A | 1/2012 |
| KR | 20120043077 A | 5/2012 |
| KR | 20140141686 A | 12/2014 |
| KR | 20140143202 A | 12/2014 |
| KR | 20150063562 A | 6/2015 |
| KR | 20160039139 A | 4/2016 |
| KR | 20160044004 A | 4/2016 |
| KR | 20160108174 A | 9/2016 |
| TW | 201120233 A | 6/2011 |
| TW | 201130045 A | 9/2011 |
| TW | 2014/05707 A | 2/2014 |
| TW | 2014/05781 A | 2/2014 |
| TW | 201413031 A | 4/2014 |
| TW | 201525173 A | 7/2015 |
| TW | 2016/26503 A | 7/2016 |
| WO | WO-2007027350 A2 | 3/2007 |
| WO | WO-2009042913 A1 | 4/2009 |
| WO | WO 2011/027834 | 10/2011 |
| WO | WO 2013/148444 | 10/2013 |
| WO | WO 2013/148490 | 10/2013 |

(56) References Cited

FOREIGN PATENT DOCUMENTS

WO    WO 2013/148880      10/2013
WO    WO 2014/105477 A1   7/2014

OTHER PUBLICATIONS

U.S. Notice of Allowance dated Jan. 14, 2016 issued in U.S. Appl. No. 14/465,610.
U.S. Office Action dated Nov. 1, 2016 issued in U.S. Appl. No. 14/873,152.
U.S. Notice of Allowance dated Apr. 27, 2017 issued in U.S. Appl. No. 14/873,152.
U.S. Office Action dated May 25, 2016 issued in U.S. Appl. No. 14/866,621.
U.S. Notice of Allowance dated Oct. 21, 2016 issued in U.S. Appl. No. 14/866,621.
U.S. Office Action dated May 18, 2017 issued in U.S. Appl. No. 14/866,621.
U.S. Final Office Action dated Oct. 19, 2017 issued in U.S. Appl. No. 14/866,621.
U.S. Notice of Allowance dated Feb. 13, 2018 issued in U.S. Appl. No. 14/866,621.
U.S. Office Action dated Feb. 5, 2019 issued in U.S. Appl. No. 15/991,413.
U.S. Final Office Action dated Jul. 5, 2019 issued in U.S. Appl. No. 15/991,413.
U.S. Notice of Allowance dated Oct. 24, 2019 issued in U.S. Appl. No. 15/991,413.
U.S. Office Action dated Oct. 30, 2020 issued in U.S. Appl. No. 16/793,464.
U.S. Final Office Action dated Apr. 8, 2021 issued in U.S. Appl. No. 16/793,464.
U.S. Office Action dated Dec. 15, 2017 issued in U.S. Appl. No. 15/156,129.
U.S. Notice of Allowance dated Aug. 10, 2018 issued in U.S. Appl. No. 15/156,129.
U.S. Office Action dated Apr. 8, 2019 issued in U.S. Appl. No. 16/189,368.
U.S. Notice of Allowance dated Oct. 23, 2019 issued in U.S. Appl. No. 16/189,368.
Office Action dated Mar. 27, 2020 issued in U.S. Appl. No. 16/786,513.
Notice of Allowance dated Oct. 5, 2020 issued in U.S. Appl. No. 16/786,513.
U.S. Office Action dated Dec. 21, 2018 issued in U.S. Appl. No. 15/673,320.
U.S. Final Office Action dated Jun. 10, 2019 issued in U.S. Appl. No. 15/673,320.
U.S. Notice of Allowance dated Sep. 26, 2019 issued in U.S. Appl. No. 15/673,320.
U.S. Office Action dated Sep. 22, 2020 issued in U.S. Appl. No. 16/724,231.
U.S. Final Office Action dated Mar. 29, 2021 issued in U.S. Appl. No. 16/724,231.
U.S. Office Action, dated Nov. 20, 2017, issued in U.S. Appl. No. 15/384,175.
U.S. Final Office Action, dated Jun. 18, 2018, issued in U.S. Appl. No. 15/384,175.
U.S. Notice of Allowance, dated Oct. 3, 2018, issued in U.S. Appl. No. 15/492,976.
U.S. Office Action dated Mar. 21, 2018 issued in U.S. Appl. No. 15/492,976.
U.S. Final Office Action dated Aug. 13, 2018 issued in U.S. Appl. No. 15/492,976.
U.S. Notice of Allowance dated Nov. 13, 2018 issued in U.S. Appl. No. 15/492,976.
U.S. Office Action dated Nov. 25, 2011 issued in U.S. Appl. No. 13/016,656.
U.S. Notice of Allowance dated Jan. 9, 2012 issued in U.S. Appl. No. 13/016,656.
U.S. Office Action, dated Jan. 15, 2015, issued in U.S. Appl. No. 13/774,350.
U.S. Office Action, dated Oct. 8, 2015, issued in U.S. Appl. No. 13/774,350.
U.S. Office Action, dated Jun. 2, 2016, issued in U.S. Appl. No. 13/774,350.
U.S. Final Office Action, dated Jan. 18, 2017, issued in U.S. Appl. No. 13/774,350.
U.S. Office Action, dated Sep. 20, 2017, issued in U.S. Appl. No. 13/774,350.
U.S. Final Office Action, dated Jul. 6, 2018, issued in U.S. Appl. No. 13/774,350.
U.S. Notice of Allowance, dated Nov. 30, 2018, issued in U.S. Appl. No. 13/774,350.
U.S. Office Action, dated May 15, 2020, issued in U.S. Appl. No. 16/294,736.
U.S. Office Action, dated Dec. 7, 2020, issued in U.S. Appl. No. 16/294,736.
U.S. Office Action, dated Mar. 26, 2018, issued in U.S. Appl. No. 15/640,940.
U.S. Final Office Action, dated Nov. 2, 2018, issued in U.S. Appl. No. 15/640,940.
U.S. Notice of Allowance, dated Mar. 12, 2019, issued in U.S. Appl. No. 15/640,940.
U.S. Office Action dated Apr. 6, 2020, issued in U.S. Appl. No. 16/457,353.
U.S. Office Action dated Dec. 8, 2020, issued in U.S. Appl. No. 16/457,353.
U.S. Office Action, dated Dec. 23, 2014, issued in U.S. Appl. No. 13/851,885.
U.S. Notice of Allowance, dated Aug. 3, 2016, issued in U.S. Appl. No. 13/851,885.
U.S. Notice of Allowance, dated Dec. 14, 2016, issued in U.S. Appl. No. 13/851,885.
U.S Notice of Allowance, dated Mar. 24, 2017, issued in U.S. Appl. No. 13/851,885.
U.S. Office Action, dated Dec. 18, 2014, issued in U.S. Appl. No. 14/502,817.
U.S. Final Office Action, dated Jul. 17, 2015, issued in U.S. Appl. No. 14/502,817.
U.S. Notice of Allowance, dated Sep. 25, 2015, issued in U.S. Appl. No. 14/502,817.
U.S. Office Action, dated Sep. 2, 2016, issued in U.S. Appl. No. 14/965,806.
U.S. Final Office Action, dated Apr. 14, 2017, issued in U.S. Appl. No. 14/965,806.
U.S. Office Action, dated Sep. 11, 2017, issued in U.S. Appl. No. 14/965,806.
U.S. Office Action, dated Dec. 12, 2017, issued in U.S. Appl. No. 15/482,271.
U.S. Notice of Allowance, dated Jun. 6, 2018, issued in U.S. Appl. No. 15/482,271.
U.S. Office Action, dated Sep. 24, 2019, issued in U.S. Appl. No. 16/124,050.
U.S. Final Office Action dated Feb. 6, 2020 issued in U.S. Appl. No. 16/124,050.
U.S. Office Action dated Jun. 23, 2020 issued in U.S. Appl. No. 16/124,050.
U.S. Final Office Action dated Dec. 15, 2020 issued in U.S. Appl. No. 16/124,050.
U.S. Notice of Allowance dated Mar. 17, 2021 issued in U.S. Appl. No. 16/124,050.
Chinese First Office Action dated Dec. 12, 2017 issued in Application No. CN 201510518752.1.
Chinese Second Office Action dated Aug. 24, 2018 issued in Application No. CN 201510518752.1.
Chinese Third Office [*Decision of Final Rejection*] Action dated Mar. 6, 2019 issued in Application No. CN 201510518752.1.
Japanese First Office Action dated Jun. 13, 2019 issued in Application No. JP 2015-162354.

(56) References Cited

OTHER PUBLICATIONS

Japanese Second Office Action dated Feb. 16, 2020 issued in Application No. JP 2015-162354.
Taiwanese First Office Action dated Apr. 18, 2019 issued in Application No. TW 104127083.
Taiwanese Second Office Action dated Mar. 10, 2020 issued in Application No. TW 104127083.
Chinese First Office Action dated Dec. 20, 2017 issued in Application No. CN 201510644832.1.
Chinese Second Office Action dated Aug. 17, 2018 issued in Application No. CN 201510644832.1.
Chinese Third Office Action dated Feb. 14, 2019 issued in Application No. CN 201510644832.1.
Taiwanese First Office Action dated Mar. 28, 2019 issued in Application No. TW 104132010.
Taiwanese Second Office Action dated Feb. 6, 2020 issued in Application No. TW 104132010.
Chinese first Office Action dated Jul. 27, 2018 issued in Application No. CN 201610332922.1.
Chinese First Office Action dated Apr. 2, 2021 issued in Application No. CN 201910499775.0.
Taiwanese First Office Action dated Sep. 5, 2019 issued in Application No. TW 105115121.
Chinese First Office Action dated Jan. 4, 2021 issued in Application No. CN 201710700258.6.
Chinese First Office Action dated Jun. 3, 2019 issued in Application No. CN 201711372325.2.
Chinese Second Office Action dated May 7, 2020 issued in Application No. CN 201711372325.2.
Chinese Third Office Action dated Dec. 1, 2020 issued in Application No. CN 201711372325.2.
Taiwanese First Office Action dated Apr. 21, 2021 issued in Application No. TW 106144306.
Korean Provisional Rejection dated Nov. 16, 2012, issued in Application No. KR 2011-0068603.
Korean First Office Action dated Sep. 26, 2016, issued in Application No. KR 10-2013-0054726.
Korean Second Office Action dated May 30, 2017, issued in Application No. KR 10-2013-0054726.
Korean Final Office Action dated Sep. 19, 2017, issued in Application No. KR 10-2013-0054726.
PCT International Search Report and Written Opinion, dated Jun. 28, 2013, issued in PCT/US2013/033174.
PCT International Preliminary Report on Patentability and Written Opinion, dated Oct. 9, 2014, issued in PCT/US2013/033174.
Chinese First Office Action dated Feb. 26, 2016, issued in CN 201380022648.2.
Japanese Office Action dated Jan. 24, 2017, issued in JP 2015-514160.
Taiwan Office Action and Search Report dated Nov. 22, 2016 issued in Application No. TW 102110937.
Korean Office Action dated Jun. 18, 2019 issued in Application No. KR 10-2014-7029798.
Korean Second Office Action dated Oct. 25, 2019 issued in Application No. KR 10-2014-7029798.
Korean Decision for Grant dated Jan. 15, 2020 issued in Application No. KR 10-2014-7029798.
PCT International Search Report and Written Opinion, dated Jul. 26, 2013, issued in PCT/US2013/034167.
PCT International Preliminary Report on Patentability and Written Opinion, dated Oct. 9, 2014, issued in PCT/US2013/034167.
Chinese First Office Action dated Mar. 18, 2016 issued in Application No. CN 201380022693.8.
Chinese Second Office Action dated Jan. 23, 2017 issued in Application No. CN 201380022693.8.
Chinese Third Office Action dated Sep. 25, 2017 issued in Application No. CN 201380022693.8.
Chinese Fourth Office Action dated Mar. 15, 2018 issued in Application No. CN 201380022693.8.

Chinese Fifth Office Action dated Aug. 24, 2018 issued in Application No. CN 201380022693.8.
Chinese First Office Action dated Oct. 27, 2020 issued in Application No. CN 201811491805.5.
Japanese Notification of Reasons for Rejection dated Dec. 20, 2016 issued in Application No. JP 2015-503547.
Korean First Office Action dated Apr. 18, 2019 issued in Application No. KR 10-2014-7030125.
Korean Notice of Allowance dated Apr. 7, 2020 issued in Application No. KR 10 2020-7000199.
Taiwan Office Action dated Oct. 25, 2016 issued in Application No. TW 102110947.
Van Zant, P., "Microchip fabrication: a practical guide to semiconductor processing" 4th ed., (2000) p. 263. [ISBN 0-07-135636-3].
Williams et al., "Etch Rates for Micromachining Processing—Part II" Journal of Microelectromechanical Systems, vol. 12, No. 6, Dec. 2003, pp. 761-778.
PCT International Search Report and Written Opinion, dated Mar. 27, 2020, issued in PCT/US2019/064768.
Advisory Action dated Sep. 1, 2021, in U.S. Appl. No. 16/294,736.
Advisory Action dated Sep. 1, 2021, in U.S. Appl. No. 16/457,353.
Chinese Second Office Action dated Jun. 17, 2021 issued in Application No. CN 201710700258.6.
CN Office action dated Apr. 7, 2022 in CN Application No. CN201910499775 with English translation.
CN Office action dated Aug. 2, 2022 in CN Application No. CN201910499775 with English translation.
CN Office Action dated Aug. 16, 2023, in Application No. CN201810358633.8 with English translation.
CN Office Action dated Dec. 8, 2022, in Application No. CN201980081000.X with English translation.
CN Office Action dated Feb. 15, 2023, in Application No. CN201810358633.8 with English translation.
CN Office Action dated Jun. 29, 2023, in Application No. CN201980081000.X with English translation.
CN Office Action dated Mar. 31, 2023, in Application No. CN201910729470.4 with English translation.
CN Office Action dated Oct. 11, 2023, in application No. CN202110914064.2 with English translation.
CN Office Action dated Oct. 12, 2023, in application No. CN202110637340.5 with English translation.
CN Office action dated Oct. 25, 2021 in CN Application No. CN201910499775 with English translation.
CN Office Action dated Oct. 26, 2022 in Application No. CN201910729470 With English Translation.
Co-pending U.S. Appl. No. 17/497,702, filed Oct. 8, 2021.
International Preliminary Report on Patentability and written opinion dated Sep. 15, 2022, in PCT Application No. PCT/US2021/020748.
International Preliminary Report on Patentability dated Jun. 17, 2021 issued in Application No. PCT/US2019/064768.
International Preliminary Report on Patentability dated Oct. 6, 2022, in PCT Application No. PCT/US2021/022152.
International Search Report and Written Opinion dated Jul. 1, 2021 in Application No. PCT/US2021/022152.
International Search Report and Written Opinion dated Jun. 18, 2021, in PCT Application No. PCT/US2021/020748.
JP Office Action dated Nov. 28, 2023 in JP Application No. 2021-531900, with English Translation.
Kim, C. et al., "Pulsed CVD-W Nucleation Layer Using WF6 and B2H6 for Low Resistivity W", Journal of The Electrochemical Society, 2009, vol. 156, No. 9, pp. H685-H689.
KR Office Action dated Aug. 1, 2022, in Application No. 10-2017-0172906 with English translation.
KR Office Action dated Dec. 28, 2022 in Application No. KR10-2015-0137906 with English translation.
KR Office Action dated Feb. 8, 2022, in Application No. 10-2017-0172906 with English translation.
KR Office Action dated Feb. 14, 2023 in Application No. KR10-2023-0013752 with English translation.
KR Office Action dated Feb. 21, 2022, in Application No. KR10-2017-0102113 with English Translation.

(56) References Cited

OTHER PUBLICATIONS

KR Office Action dated Feb. 23, 2023 in Application No. KR10-2018-0044769 with English translation.
KR Office Action dated Jan. 27, 2023 in Application No. KR10-2017-0102113 with English Translation.
KR Office Action dated Jul. 28, 2023, in Application No. KR10-2023-0081299 with English Translation.
KR Office Action dated Jun. 26, 2022 in Application No. KR10-2015-0137906 with English translation.
KR Office Action dated May 12, 2023 in Application No. KR10-2016-0060657 with English translation.
KR Office Action dated Nov. 1, 2022, in Application No. 10-2017-0172906 with English translation.
KR Office Action dated Oct. 26, 2023 in KR Application No. 10-2015-0137906, with English Translation.
KR Office Action dated Sep. 27, 2022, in Application No. KR10-2017-0102113 with English translation.
Taiwanese First Office Action dated Jul. 23, 2021 issued in Application No. TW 107113100.
TW Office Action dated Jun. 28, 2023 in Application No. TW111120546 with English translation.
U.S. Advisory Action dated Aug. 11, 2023, in U.S. Appl. No. 17/497,702.
U.S. Corrected Notice of Allowance dated Jun. 30, 2022 in U.S. Appl. No. 16/294,736.
U.S. Corrected Notice of Allowance dated Aug. 8, 2022 in U.S. Appl. No. 16/457,353.
U.S. Corrected Notice of Allowance dated Feb. 16, 2022, in U.S. Appl. No. 16/724,231.
U.S. Corrected Notice of Allowance dated May 11, 2022, in U.S. Appl. No. 16/724,231.
U.S. Final Office Action, dated Jun. 14, 2021, issued in U.S. Appl. No. 16/294,736.
U.S. Final Office Action dated Jun. 14, 2021, issued in U.S. Appl. No. 16/457,353.
U.S. Final Office Action dated Jun. 28, 2023, in U.S. Appl. No. 17/359,068.
U.S. Final Office Action dated May 16, 2023 in U.S. Appl. No. 17/497,702.
U.S. Non-Final Office Action dated Feb. 2, 2023 in U.S. Appl. No. 17/497,702.
U.S. Non-Final office Action dated Jan. 5, 2023 in U.S. Appl. No. 17/359,068.
U.S. Non-Final Office Action dated Jul. 7, 2023, in U.S. Appl. No. 17/809,480.
U.S. Non-Final Office Action dated Jun. 22, 2023, in U.S. Appl. No. 17/814,297.
U.S. Non-Final Office Action dated Nov. 8, 2023 in U.S. Appl. No. 17/359,068.
U.S. Notice of Allowance dated Apr. 27, 2022 in U.S. Appl. No. 16/457,353.
U.S. Notice of Allowance dated Feb. 2, 2022 in U.S. Appl. No. 16/724,231.
U.S. Notice of Allowance dated Mar. 23, 2022 in U.S. Appl. No. 16/294,736.
U.S. Notice of Allowance dated Sep. 5, 2023, in U.S. Appl. No. 17/497,702.
U.S. Notice of allowance dated Sep. 29, 2021 issued in U.S. Appl. No. 16/724,231.
U.S. Appl. No. 17/809,480, inventors Chandrashekar et al., filed Jun. 28, 2022.
U.S. Appl. No. 17/907,377 inventors Khare et al., filed Sep. 26, 2022.
U.S. Appl. No. 17/907,959, inventors Birru et al., filed Aug. 29, 2022.
U.S. Restriction Requirement dated Sep. 15, 2022 in U.S. Appl. No. 17/359,068.
CN Office Action dated Dec. 28, 2023 in CN Application No. 201980081000.X with English Translation.
KR Office Action dated Feb. 26, 2024 in KR Application No. 10-2015-0137906, with English Translation.
U.S. Corrected Notice of Allowance dated Jan. 10, 2024 in U.S. Appl. No. 17/497,702.
U.S. Notice of Allowance dated Feb. 26, 2024 in U.S. Appl. No. 17/809,480.
U.S. Notice of Allowance dated Mar. 15, 2024 in U.S. Appl. No. 17/809,480.

* cited by examiner

VOID FREE LOW STRESS FILL

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

Deposition of conductive materials such as tungsten films is an integral part of many semiconductor fabrication processes. These materials may be used for horizontal interconnects, vias between adjacent metal layers, contacts between metal layers and devices on the silicon substrate, and high aspect ratio features. As devices shrink and more complex patterning schemes are utilized in the industry, deposition of thin films becomes a challenge. These challenges include depositing void free and low stress films.

The background and contextual descriptions contained herein are provided solely for the purpose of generally presenting the context of the disclosure. Much of this disclosure presents work of the inventors, and simply because such work is described in the background section or presented as context elsewhere herein does not mean that it is admitted to be prior art.

SUMMARY

One aspect of the disclosure relates to a method including: providing a 3-D structure including metal lines arranged in a staircase pattern, a dielectric material overlying the staircase pattern, and a vertically-oriented feature providing fluidic access to a metal line; depositing a conformal layer of metal in the vertically-oriented feature; exposing the conformal layer of metal feature to inhibition species at first flow rate and first exposure time in a first inhibition operation; after the first inhibition operation, preferentially depositing metal at the bottom of the vertically-oriented feature in a first non-conformal deposition operation, where a temperature of the substrate is at least 400° C. during the first non-conformal deposition operation; after the first non-conformal deposition operation, exposing the feature to inhibition species at a second flow rate and second exposure time in a second inhibition operation, where the second flow rate is lower than the first flow rate and/or the second exposure time is lower than the first exposure time; and after the second inhibition operation, depositing metal in the feature at a substrate temperature of at least 400° C. in a second non-conformal deposition operation.

In some embodiments the metal is one of tungsten, cobalt, molybdenum, and ruthenium. In some embodiments preferentially depositing metal at the bottom of the feature includes exposing the feature to a metal precursor and a reducing agent, where the volumetric ratio of reducing agent to metal precursor is at least 30:1. In some embodiments preferentially depositing metal at the bottom of the feature includes exposing the feature to a metal precursor at flow rate of no more than 100 sccm. In some embodiments the feature is an interconnect feature in a 3D NAND device. In some embodiments the metal is tungsten and the substrate temperature is at least 430° C. during deposition. In some embodiments the metal is molybdenum and the substrate temperature is at least 600° C. during deposition.

In some embodiments the inhibition species are nitrogen-containing gas or plasma species. In some embodiments the first inhibition operation treats most of the feature. The method the first inhibition operation treats at least 70% of the feature depth. In some embodiments a substrate temperature during the first inhibition operation is different than during the second inhibition operation.

Another aspect of the disclosure relates to an apparatus for processing substrates, the apparatus including: (a) a process chamber including at least one station having a pedestal configured to hold a substrate; (b) at least one outlet for coupling to a vacuum; (c) one or more process gas inlets coupled to one or more process gas sources; and (d) a controller for controlling operations in the apparatus, including machine-readable instructions for performing the method of: inletting inhibition species at first flow rate and first exposure time to the process chamber in a first inhibition operation; after the first inhibition operation, inletting a metal precursor and reducing agent to deposit a metal, where a temperature of the pedestal on which the substrate is at least 400° C., in a first non-conformal deposition operation; after the first non-conformal deposition operation, inletting inhibition species to the process chamber at a second flow rate and second exposure time in a second inhibition operation, where the second flow rate is lower than the first flow rate and/or the second exposure time is lower than the first exposure time; and after the second inhibition operation, inletting a metal precursor and reducing agent to deposit a metal, where a temperature of the pedestal on which the substrate is at least 400° C. In some embodiments the metal is tungsten and the substrate temperature is at least 430° C. during deposition, in a second non-conformal deposition operation. In some embodiments the volumetric ratio of reducing agent to tungsten precursor is at least 30:1 during the first and second non-conformal deposition operations.

Another aspect of the disclosure relates to a method including: depositing a conformal layer of metal in a feature on a substrate; treating a portion of the conformal layer to inhibit subsequent tungsten nucleation; after treating the portion of the conformal layer, preferentially depositing tungsten at the bottom of the feature, where a temperature of the substrate is at least 400° C. during the deposition; and repeating the treating and depositing operations one or more times to fill the feature with metal.

These and other aspects are described below with references to the drawings.

DETAILED DESCRIPTION

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific implementations, it will be understood that it is not intended to limit the invention to the implementations.

Described herein are methods of feature fill and related systems and apparatus. Examples of applications include logic and memory contact fill, DRAM buried wordline fill, vertically integrated memory gate/wordline fill, and 3-D integration with through-silicon vias (TSVs). In some embodiments, the methods may be used for tungsten feature fill. Such features can include vertical features, such as vias, and horizontal features, such as vertical NAND (VNAND) wordlines.

In some embodiments, provided herein are methods of depositing low stress and void free metal films in deep features and related apparatus. Embodiments of the methods include treating the sidewalls of the holes to inhibit metal deposition while leaving the feature bottom untreated. In subsequent deposition operations, metal precursor molecules diffuse to the feature bottom for deposition. The process is repeated with subsequent inhibition operations treating the remaining exposed sidewalls. By repeating inhibition and deposition operations, high quality void free fill can be achieved. This allows high temperature, low stress deposition to be performed.

Figure 1A:
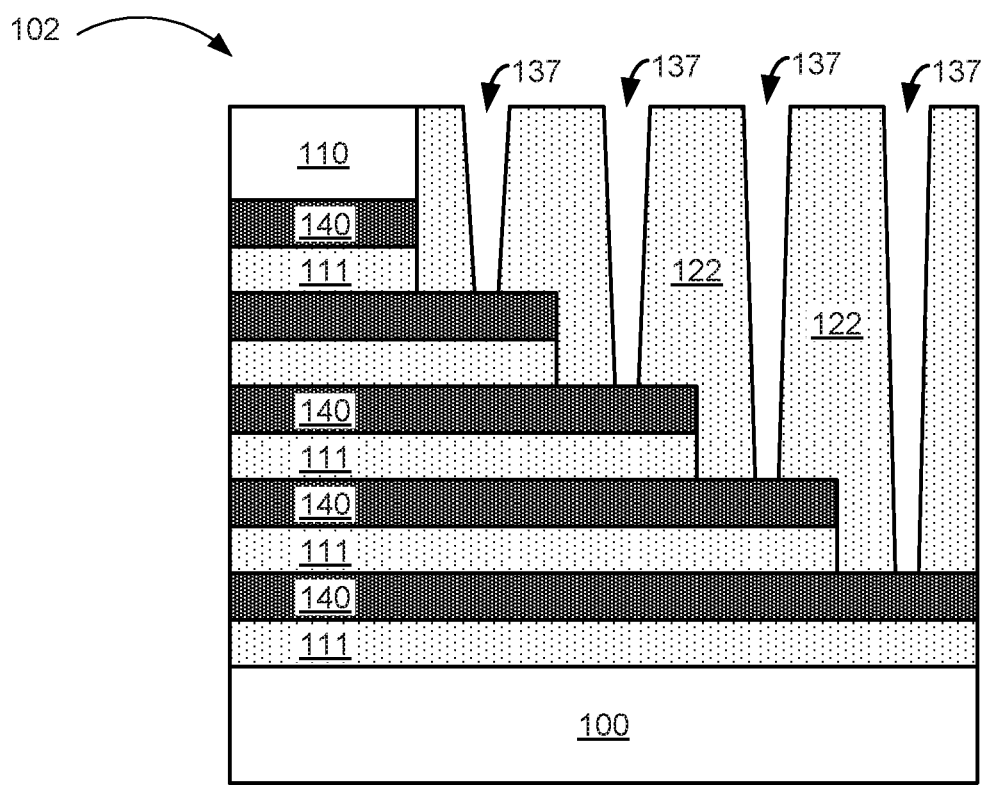
FIG. 1A shows a schematic example 3D structure that may be filled with a conductive material using the feature fill methods described herein.

FIG. 1A shows an example structure that may be filled with a conductive material using the feature fill methods described herein. In the example of FIG. 1A, the structure 102 is a partially fabricated 3D NAND device. Alternating oxide layers 111 and tungsten or other metal wordlines 140 on a substrate 100 are shown in a staircase structure. Although five wordlines 140 are depicted for ease of illustration, according to various implementations, a structure 102 may include any number of wordlines, such 48 wordlines, 256 wordlines, 512 wordlines, or 1024 wordlines. In some implementations, the feature to be filled is at least 10 microns deep, and may be deeper, e.g., 30 microns deep.

Figure 1B:
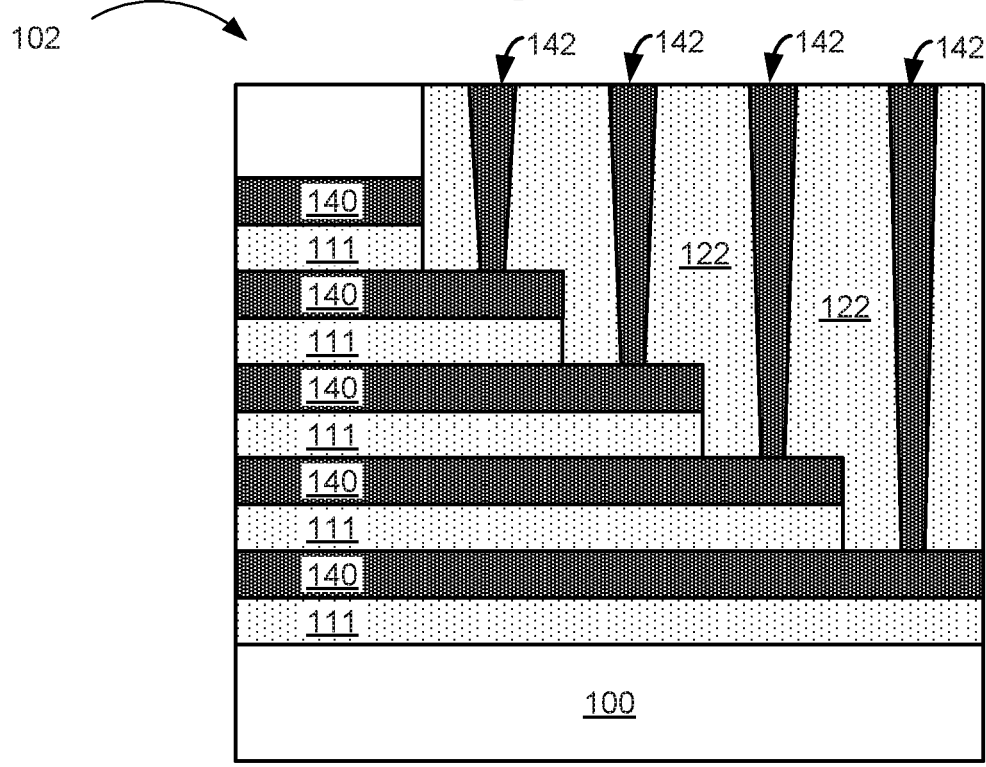
FIG. 1B shows a schematic example of interconnects of the 3D structure after a feature fill process using the methods described herein.

An oxide layer 122 is deposited over the staircase structure, with features 137 etched in the oxide layer 122. These features 137 may be filled with tungsten or other metal using the methods described herein to provide interconnects to the wordlines 140. FIG. 1B shows interconnects 142 after a fill process.

Figure 2:
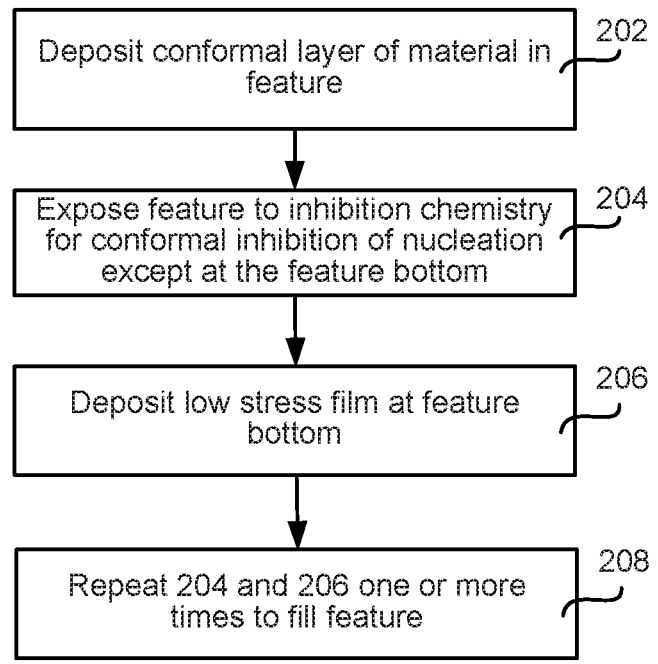
FIG. 2 is a flow diagram illustrating certain operations in a method of filling a feature.
Figure 3:
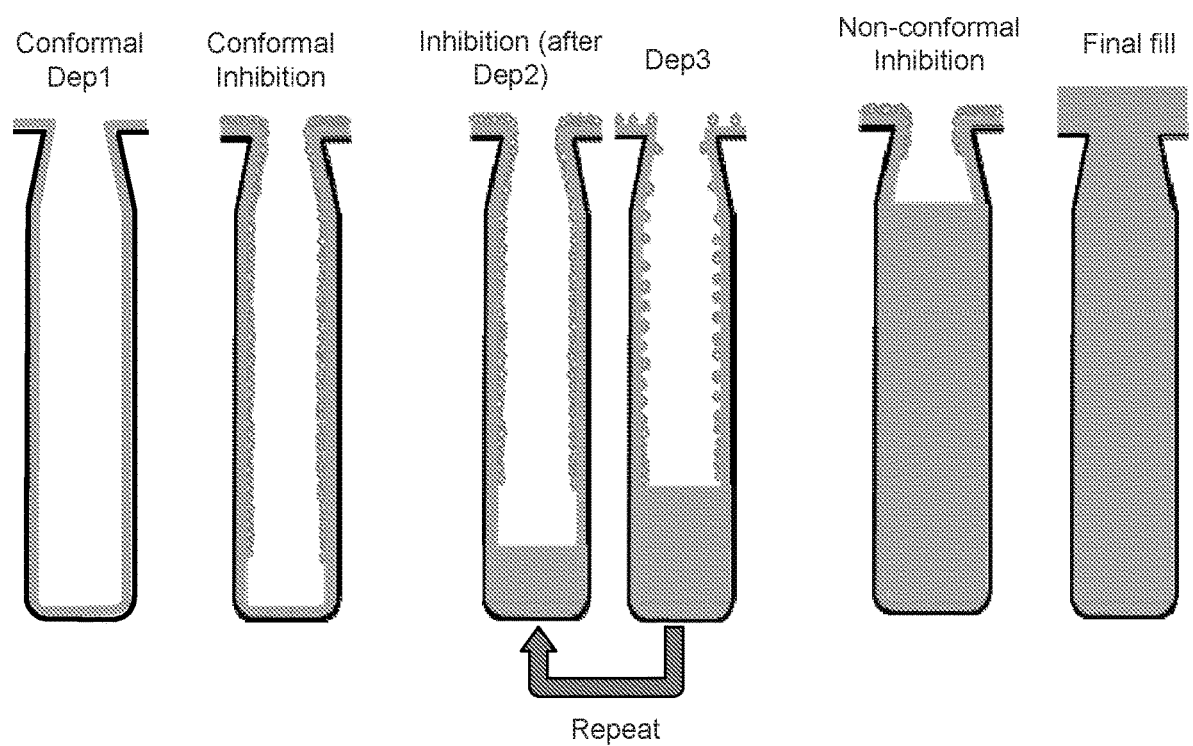
FIG. 3 shows schematic examples of a feature at various stages of a fill process using the methods described herein.

FIG. 2 is a flow diagram illustrating certain operations in a method of filling a feature. The method begins at an operation 202 with depositing a conformal layer of material in the feature. This layer can be a nucleation layer or a bulk layer that conformally lines the feature. In certain implementations, operation 202 may be omitted, for example, if the underlying feature surface is sensitive to the subsequent inhibition chemistry. In the example of tungsten, operation 202 may involve exposing the feature to a tungsten precursor, such as tungsten hexafluoride ($WF_6$) and a reducing agent such as hydrogen ($H_2$). FIG. 3 shows an example of a feature after conformal deposition (labeled Conformal Dep1). Returning to FIG. 2, the feature is then exposed to an inhibition chemistry for conformal inhibition of nucleation except at the feature bottom. (204). An example of operation 204 is illustrated in FIG. 3 (labeled Conformal Inhibition) with the circles indicating an inhibited surface. An inhibited surface is one on which subsequent nucleation of the tungsten or other material is inhibited, delaying or preventing deposition thereon. As can be seen in FIG. 3, most of feature is inhibited except for the feature bottom and a short length of sidewall extending up from the bottom. According to various embodiments, the inhibition may extend up to 99%, 95%, 90%, 80%, 70%, or 60% of the feature depth.

In some implementations, operation 204 involves exposing the feature to a nitrogen-containing compound such as nitrogen ($N_2$) or ammonia ($NH_3$) in a thermal (non-plasma) operation. In alternate embodiments, the inhibition chemistry may be provided as plasma species generated in a remote or direct plasma generator.

Returning to FIG. 2, a low stress film is deposited at the feature bottom (206). To deposit a low stress film, the feature may be exposed to a precursor and reducing agent in a precursor-depleted regime at high temperatures. The precursor-depleted regime may be characterized as having at a volumetric reducing agent:precursor flow rate ratio of least 30:1. In some embodiments, a substrate temperature of at least 400° C. are used.

For tungsten deposition with $WF_6$, substrate temperatures of at least 400° C., or at least 430° C., and no more than 100 sccm $WF_6$ may be used. Chamber pressure may be between 5 and 200 Torr, inclusive. The $WF_6$ is delivered with $H_2$ and a carrier gas such as argon (Ar). The $H_2$ and carrier gas flows are at least an order of magnitude greater than the precursor flow. Example ranges are below:

$WF_6$ flow rate of less than 100 sccm;
$H_2$ flow rate between 3000 and 6000 sccm;
Ar flow rate between 4000 and 8000 sccm.

For Mo deposition, temperatures may be at least 450° C., e.g., between 450° C. and 800° C., e.g., between 600° C. and 750° C.

Operation 204 may be performed simultaneous exposure of two reactants, such that both reactants are flowed at the same time during deposition. For example, bulk tungsten may be deposited by exposing a substrate to hydrogen ($H_2$) and tungsten hexafluoride ($WF_6$) at the same times. Hydrogen and $WF_6$ (or other metal precursor) react during the exposure to deposit tungsten into the features. In pulsed CVD processes, one reactant is continuously flowed while the other reactant is pulsed, but the substrate is exposed to both reactants during deposition to deposit material during each pulse. For example, a substrate may be exposed to a continuous flow of $H_2$ while $WF_6$ is pulsed, and $WF_6$ and $H_2$ react during the pulse to deposit tungsten. In some embodiments, operation 204 may involve separate exposures to each reactant such that the reactants are not flowed into the chamber at the same time during deposition. Rather, each reactant flow is introduced to a chamber housing the substrate in temporally separated pulses in sequence, repeated one or more times in cycles. In such embodiments, a precursor-depleted regime may be implemented by using more reducing agent pulses and/or volumetric flow rate during the pulses.

Deposition in a precursor-depleted regime and high temperature results in a low stress film; however, these conditions also make feature fill challenging as the small amount of precursor available to react will do so at the nearest available reaction surface. Without inhibition, the precursor will be consumed at the feature top, closing off the feature to further diffusion and creating a void. Thus, the inhibition in the previous operation prevents reaction on the sidewall surfaces, guiding the precursor to the bottom of the feature for reaction. This is illustrated in FIG. 3 (see Inhibition after Dep2) with the second deposition (Dep2) depositing material at the bottom of the feature. Returning to FIG. 2, operations 204 and 206 are repeated one or more times (208). This is illustrated in FIG. 3 (Dep2+Inhibition and Dep3). As depicted in FIG. 3, the inhibition wears off during the deposition.

Each successive inhibition may be considered "less conformal" than the previous deposition in that it extends to shallower depths to accommodate the film growth at the feature bottom. To control inhibition depth, temperature and inhibition gas flow rate may be adjusted with higher temperatures and lower flow rates resulting in shallower depths. However, as substrate temperature is generally determined by the requirements of the deposition, inhibition flow rate may be modified.

In some implementations, operations 204 and 206 are repeated until the feature is completely filled. In some embodiments, operations 204 and 206 may be repeated to partially fill the feature with bottom up fill, followed by a longer CVD deposition for final feature fill. A non-conformal inhibition may be performed to inhibition deposition at the top of re-entrant features, such as depicted in FIG. 3.

The deposition and inhibition operations may be performed in the same or different process chambers. Further, if performed in a multi-station chamber, they may be performed in the same or different stations. In some embodiments, one or more deposition and inhibition cycles are performed in the same station of a multi-station chamber. For example, a feature fill operation involving six deposition/inhibition cycles, and a final CVD fill operation may be implemented in a four-station chamber as follows:
  Station 1: 2 Deposition/Inhibition cycles
  Station 2: 2 Deposition/Inhibition cycles
  Station 3: 2 Deposition/Inhibition cycles
  Station 4: CVD deposition Nucleation Layer Deposition In some implementations, the methods described herein involve deposition of a tungsten nucleation layer prior to deposition of a bulk layer. In the examples described herein, the nucleation layer may be deposited as the first conformal deposition or to as a seed layer for the first conformal deposition. A nucleation layer is a thin conformal layer that facilitates subsequent deposition of bulk tungsten-containing material thereon. According to various implementations, a nucleation layer may be deposited prior to any fill of the feature and/or at subsequent points during fill of the feature. In some implementations of the method described herein, a nucleation layer is deposited only at the beginning of feature fill and is not necessary at subsequent depositions.

In certain implementations, the nucleation layer is deposited using a pulsed nucleation layer (PNL) technique. In a PNL technique, pulses of a reducing agent, optional purge gases, and tungsten-containing precursor are sequentially injected into and purged from the reaction chamber. The process is repeated in a cyclical fashion until the desired thickness is achieved. PNL broadly embodies any cyclical process of sequentially adding reactants for reaction on a semiconductor substrate, including atomic layer deposition (ALD) techniques. Nucleation layer thickness can depend on the nucleation layer deposition method as well as the desired quality of bulk deposition. In general, nucleation layer thickness is sufficient to support high quality, uniform bulk deposition. Examples may range from 10 Å-100 Å.

While examples of PNL deposition are provided above, the methods described herein are not limited to a particular method of tungsten nucleation layer deposition, but include deposition of bulk tungsten film on tungsten nucleation layers formed by any method including PNL, ALD, CVD, and physical vapor deposition (PVD). Moreover, in certain implementations, bulk tungsten may be deposited directly in a feature without use of a nucleation layer. For example, in some implementations, the feature surface and/or an already-deposited under-layer supports bulk tungsten deposition. In some implementations, a bulk tungsten deposition process that does not use a nucleation layer may be performed.

In various implementations, tungsten nucleation layer deposition can involve exposure to a tungsten-containing precursor such as tungsten hexafluoride ($WF_6$), tungsten hexachloride ($WCl_6$), and tungsten hexacarbonyl ($W(CO)_6$). In certain implementations, the tungsten-containing precursor is a halogen-containing compound, such as $WF_6$. Organo-metallic precursors, and precursors that are free of fluorine such as MDNOW (methylcyclopentadienyl-dicarbonylnitrosyl-tungsten) and EDNOW (ethylcyclopentadienyl-dicarbonylnitrosyl-tungsten) may also be used.

Examples of reducing agents can include boron-containing reducing agents including diborane ($B_2H_6$) and other boranes, silicon-containing reducing agents including silane ($SiH_4$) and other silanes, hydrazines, and germanes. In some implementations, pulses of tungsten-containing precursors can be alternated with pulses of one or more reducing agents, e.g., S/W/S/W/B/W, etc., W represents a tungsten-containing precursor, S represents a silicon-containing precursor, and B represents a boron-containing precursor. In some implementations, a separate reducing agent may not be used, e.g., a tungsten-containing precursor may undergo thermal or plasma-assisted decomposition.

According to various implementations, hydrogen may or may not be run in the background. Further, in some implementations, deposition of a tungsten nucleation layer may be followed by one or more treatment operations prior to tungsten bulk deposition. Treating a deposited tungsten nucleation layer to lower resistivity may include pulses of reducing agent and/or tungsten precursor.

Bulk Deposition

In many implementations, tungsten bulk deposition can occur by a CVD process in which a reducing agent and a tungsten-containing precursor are flowed into a deposition chamber to deposit a bulk fill layer in the feature. An inert carrier gas may be used to deliver one or more of the reactant streams, which may or may not be pre-mixed. Unlike PNL or ALD processes, this operation generally involves flowing the reactants continuously until the desired amount is deposited. In certain implementations, the CVD operation may take place in multiple stages, with multiple periods of continuous and simultaneous flow of reactants separated by periods of one or more reactant flows diverted.

Various tungsten-containing gases including, but not limited to, $WF_6$, $WCl_6$, and $W(CO)_6$ can be used as the tungsten-containing precursor. In certain implementations, the tungsten-containing precursor is a halogen-containing compound, such as $WF_6$. In certain implementations, the reducing agent is hydrogen gas, though other reducing agents may be used including silane ($SiH_4$), disilane ($Si_2H_6$) hydrazine ($N_2H_4$), diborane ($B_2H_6$) and germane ($GeH_4$). In many implementations, hydrogen gas is used as the reducing agent in the CVD process. In some other implementations, a tungsten precursor that can decompose to form a bulk tungsten layer can be used. Bulk deposition may also occur using other types of processes including ALD processes.

It should be understood that the tungsten films described herein may include some amount of other compounds, dopants and/or impurities such as nitrogen, carbon, oxygen, boron, phosphorous, sulfur, silicon, germanium and the like, depending on the particular precursors and processes used. The tungsten content in the film may range from 20% to 100% (atomic) tungsten. In many implementations, the films are tungsten-rich, having at least 50% (atomic) tungsten, or even at least about 60%, 75%, 90%, or 99% (atomic) tungsten.

While the description above focuses on tungsten feature fill, aspects of the disclosure may also be implemented in filling features with other materials. For example, feature fill using one or more techniques described herein may be used to fill features with other materials including other tungsten-containing materials (e.g., tungsten nitride (WN) and tungsten carbide (WC)), titanium-containing materials (e.g., titanium (Ti), titanium nitride (TiN), titanium silicide (TiSi), titanium carbide (TiC) and titanium alumide (TiAl)), tantalum-containing materials (e.g., tantalum (Ta), and tantalum nitride (TaN)), nickel-containing materials (e.g., nickel (Ni) and nickel silicide (NiSi), cobalt-containing materials (e.g., cobalt (Co)), ruthenium-containing materials (e.g., ruthenium (Ru)) and molybdenum-containing materials (e.g., molybdenum (Mo)).

CVD and ALD deposition of these materials can include using any appropriate precursors. For example, CVD and ALD deposition of tungsten nitride can include using tungsten-containing and nitrogen-containing compounds. CVD and ALD deposition of titanium-containing layers can include using precursors containing titanium with examples including tetrakis(dimethylamino)titanium (TDMAT) and titanium chloride ($TiCl_4$), and if appropriate, one or more co-reactants. CVD and ALD deposition of tantalum-containing layers can include using precursors such as pentakis-dimethylamino tantalum (PDMAT) and $TaF_5$ and, if appropriate, one or more co-reactants. CVD and ALD deposition of cobalt-containing layers can include using precursors such as Tris(2,2,6,6-tetramethyl-3,5-heptanedionato)cobalt, bis(cyclopentadienyl)cobalt, and dicobalt hexacarbonyl butylacetylene, and one or more co-reactants.

Examples of cobalt precursors dicarbonyl cyclopentadienyl cobalt, cobalt carbonyl, a cobalt amidinate precursor, a cobalt diazadienyl complex, and a cobalt amidinate/guanidinate precursor.

Examples of ruthenium precursors that may be used for oxidative reactions include (ethylbenzyl)(1-ethyl-1,4-cyclohexadienyl)Ru(0), 2,3-dimethyl-1,3-butadienyl)Ru(0)tricarbonyl, (1,3-cyclohexadienyl)Ru(0)tricarbonyl, and (cyclopentadienyl)(ethyl)Ru(II)dicarbonyl. Examples of ruthenium precursors that may be used for oxidative reactions include (ethylbenzyl)(1-ethyl-1,4-cyclohexadienyl)Ru (0), (1-isopropyl-4-methylbenzyl)(1,3-cyclohexadienyl)Ru (0), 2,3-dimethyl-1,3-butadienyl)Ru(0)tricarbonyl, (1,3-cyclohexadienyl)Ru(0)tricarbonyl, and (cyclopentadienyl) (ethyl)Ru(II)dicarbonyl. Examples of ruthenium precursors that react with non-oxidizing reactants are bis(5-methyl-2, 4-hexanediketonato)Ru(II)dicarbonyl and bis(ethylcyclopentadienyl)Ru(II).

Examples of nickel precursors include cyclopentadienyl-allylnickel ($CpAllylNi$) and $MeCp_2Ni$.

Examples of molybdenum precursors include molybdenum hexafluoride ($MoF_6$), molybdenum pentachloride ($MoCl_5$), molybdenum dichloride dioxide ($MoO_2Cl_2$), molybdenum tetrachloride oxide ($MoOCl_4$), and molybdenum hexacarbonyl ($Mo(CO)_6$) may be used. Examples of co-reactants can include $N_2$, $NH_3$, $N_2H_4$, $N_2H_6$, $SiH_4$, $Si_3H_6$, $B_2H_6$, $H_2$, and $AlCl_3$.

The metal-containing precursor may be reacted with a reducing agent as described above. In some embodiments, $H_2$ is used as a reducing agent for bulk layer deposition to deposit high purity films.

Inhibition of Nucleation

Inhibition can involve exposure to activated species that passivate the feature surfaces. For example, in certain implementations, a tungsten (W) surface can be passivated by exposure to a nitrogen-based or hydrogen-based plasma. In some implementations, inhibition can involve a chemical reaction between activated species and the feature surface to form a thin layer of a compound material such as tungsten nitride (WN) or tungsten carbide (WC). In some implementations, inhibition can involve a surface effect such as adsorption that passivates the surface without forming a layer of a compound material. Activated species may be formed by any appropriate method including by plasma generation and/or exposure to ultraviolet (UV) radiation. In some implementations, the substrate including the feature is exposed to a plasma generated from one or more gases fed into the chamber in which the substrate sits. In some implementations, one or more gases may be fed into a remote plasma generator, with activated species formed in the remote plasma generator fed into a chamber in which the substrate sits. The plasma source can be any type of source including radio frequency (RF) plasma source or microwave source. The plasma can be inductively and/or capacitively-coupled. Activated species can include atomic species, radical species, and ionic species. In certain implementations, exposure to a remotely-generated plasma includes exposure to radical and atomized species, with substantially no ionic species present in the plasma such that the inhibition process is not ion-mediated. In other implementations, ion species may be present in a remotely-generated plasma. In certain implementations, exposure to an in-situ plasma involves ion-mediated inhibition.

For W surfaces, exposure to nitrogen-based and/or hydrogen-based plasmas inhibits subsequent tungsten deposition on the W surfaces. Other chemistries that may be used for inhibition of tungsten surfaces include oxygen-based plasmas and hydrocarbon-based plasmas. For example, molecular oxygen or methane may be introduced to a plasma generator. Nitrogen-containing chemistries also inhibit nucleation of other metals described herein including Mo, Co, and Al. As used herein, a nitrogen-based plasma is a plasma in which the main non-inert component is nitrogen. An inert component such as argon, xenon, or krypton may be used as a carrier gas. In some implementations, no other non-inert components are present in the gas from which the plasma is generated except in trace amounts. In some implementations, inhibition chemistries may be nitrogen-containing, hydrogen-containing, oxygen-containing, and/or carbon-containing, with one or more additional reactive species present in the plasma.

Using a $NF_3$ plasma, for example, where activated fluorine radicals react with and remove tungsten at the feature opening, the nitrogen generated from the $NF_3$ plasma can cause nitridation of the tungsten surface forming tungsten nitride. Subsequent deposition of tungsten on a nitrided surface is significantly delayed, compared to on a regular bulk tungsten film. A longer delay allows the feature to stay open for longer before pinching off, and promoting fill improvement because more $WF_6$ molecules can reach the inside of the feature and deposit tungsten. In addition to $NF_3$, fluorocarbons such as $CF_4$ or $C_2F_8$ may be used. However, in certain implementations, the inhibition species are fluorine-free to prevent etching during inhibition.

In certain implementations, UV radiation and/or thermal energy may be used instead of or in addition to plasma generators to provide activated species. In addition to tungsten surfaces, nucleation may be inhibited on liner/barrier layers surfaces such as TiN and/or WN surfaces. Any chemistry that passivates these surfaces may be used. For TiN and WN, this can include exposure to nitrogen-based or nitrogen-containing chemistries. In certain implementations, the chemistries described above for W may also be employed for TiN, WN, or other liner layer surfaces. In some implementations, inhibition involves exposure to $NH_3$ in a non-plasma operation.

Tuning an inhibition profile can involve appropriately controlling an inhibition chemistry, substrate bias power, plasma power, process pressure, exposure time, and other process parameters. For in situ plasma processes (or other processes in which ionic species are present), a bias can be applied to the substrate. Substrate bias can, in some implementations, significantly affect an inhibition profile, with increasing bias power resulting in active species deeper within the feature. For 3-D structures in which selectivity is desired in a lateral direction (tungsten deposition preferred in the interior of the structure), but not in a vertical direction, increased bias power can be used to promote top-to-bottom deposition uniformity.

While bias power can be used in certain implementations as the primary or only knob to tune an inhibition profile for ionic species, in certain situations, tuning an inhibition profile uses other parameters in addition to or instead of bias power. These include remotely generated non-ionic plasma processes and non-plasma processes. Also, in many systems, a substrate bias can be easily applied to tune selectivity in vertical but not lateral direction.

Accordingly, for 3-D structures in which lateral selectivity is desired, parameters other than bias may be controlled, as described above.

Inhibition chemistry can also be used to tune an inhibition profile, with different ratios of active inhibiting species used. For example, for inhibition of W surfaces, nitrogen may have a stronger inhibiting effect than hydrogen; adjusting the ratio of $N_2$ and $H_2$ gas in a forming gas-based plasma can be used to tune a profile. The plasma power may also be used to tune an inhibition profile, with different ratios of active species tuned by plasma power. For example, in certain implementations described herein, nitrogen radical formation and resultant W—N formation and the related passivation effect can be modulated by varying the plasma power. Varying plasma power can also allow control of the resistivity of the final W film.

Process pressure can be used to tune a profile, as pressure can cause more recombination (deactivating active species) as well as pushing active species further into a feature. Process time may also be used to tune inhibition profiles, with increasing treatment time causing inhibition deeper into a feature.

In some implementations, non-conformal inhibition can be achieved by in a mass transport limited regime. In this regime, the inhibition rate inside the feature is limited by amounts of and/or relative compositions of different inhibition material components (e.g., an initial inhibition species, activated inhibition species, and recombined inhibition species) that diffuse into the feature. In certain examples, inhibition rates depend on various components' concentrations at different locations inside the feature.

Mass transport limiting conditions may be characterized, in part, by overall inhibition concentration variations. In certain implementations, a concentration is less inside the feature than near its opening resulting in a higher inhibition rate near the opening than inside. This in turn leads to preferential inhibition near the feature opening. Mass transport limiting process conditions may be achieved by supplying limited amounts of inhibition species into the processing chamber (e.g., use low inhibition gas flow rates relative to the cavity profile and dimensions), while maintaining relative high inhibition rates near the feature opening to consume some activated species as they diffuse into the feature. In certain implementation, a concentration gradient is substantial, which may be caused relatively high inhibition kinetics and relatively low inhibition supply. In certain implementations, an inhibition rate near the opening may also be mass transport limited.

In addition to the overall inhibition concentration variations inside features, inhibition profile may be influenced by relative concentrations of different inhibition species throughout the feature. These relative concentrations in turn can depend on relative dynamics of dissociation and recombination processes of the inhibition species. As described above, an initial inhibition material, such as molecular nitrogen, can be passed through a remote plasma generator and/or subjected to an in-situ plasma to generate activated species (e.g., atomic nitrogen, nitrogen ions). However, activated species may recombine into less active recombined species (e.g., nitrogen molecules) and/or react with W, WN, TiN, or other feature surfaces along their diffusion paths. As such, different parts of the feature may be exposed to different concentrations of different inhibition materials, e.g., an initial inhibition gas, activated inhibition species, and recombined inhibition species. This provides additional opportunities for controlling inhibition profile. For example, activated species are generally more reactive than initial inhibition gases and recombined inhibition species. Furthermore, in some cases, the activated species may be less sensitive to temperature variations than the recombined species. Therefore, process conditions may be controlled in such a way that removal is predominantly attributed to activated species. As noted above, some species may be more reactive than others. Furthermore, specific process conditions may result in activated species being present at higher concentrations near features' openings than inside the features. For example, some activated species may be consumed (e.g., reacted with feature surface materials and/or adsorbed on the surface) and/or recombined while diffusing deeper into the features, especially in small high aspect ratio features. Recombination of activated species can also occur outside of features, e.g., in the showerhead or the processing chamber, and can depends on chamber pressure. Therefore, chamber pressure may be controlled to adjust concentrations of activated species at various points of the chamber and features.

In certain implementations, the substrate can be heated up or cooled down before inhibition. A predetermined temperature for the substrate can be selected to induce a chemical reaction between the feature surface and inhibition species and/or promote adsorption of the inhibition species, as well as to control the rate of the reaction or adsorption. For example, a temperature may be selected to have high reaction rate such that more inhibition occurs near the opening than inside the feature. Furthermore, a temperature may be also selected to control recombination of activated species (e.g., recombination of atomic nitrogen into molecular nitrogen) and/or control which species (e.g., activated or recombined species) contribute predominantly to inhibition. In certain implementations, a substrate is maintained at less than about 300° C., or more particularly at less than about 250° C., or less than about 150° C., or even less than about 100° C. In other implementations, a substrate is heated to between about 300° C. and 450° C. or, in more specific implementations, to between about 350° C. and 400° C. Other temperature ranges may be used for different types of inhibition chemistries. In some embodiments, the inhibition temperature may be the same as the deposition temperature, which may be relatively high to deposit a low stress film. However, in some embodiments, a multi-station chamber is used with deposition and inhibition performed in different stations. This can facilitate temperature differences between the operations.

As indicated above, in some embodiments, thermal inhibition processes are used. Thermal inhibition processes can involve exposing the feature to a nitrogen-containing compound such as ammonia ($NH_3$) or hydrazine ($N_2H_4$) to conformally or non-conformally inhibit the feature. In some embodiments, the thermal inhibition processes are performed at temperatures ranging from 250° C. to 450° C. At these temperatures, exposure of a previously formed tungsten nucleation layer to $NH_3$ results in an inhibition effect. Other potentially inhibiting chemistries such as nitrogen ($N_2$) or hydrogen ($H_2$) may be used for thermal inhibition at higher temperatures (e.g., 900° C.). For many applications, however, these high temperatures exceed the thermal budget. In addition to ammonia, other hydrogen-containing nitriding agents such as hydrazine may be used at lower temperatures appropriate for back end of line (BEOL) applications.

As the thermal inhibition processes do not use a plasma, a bias power on the substrate cannot be used to tune the inhibition profile. However, by appropriately tuning one or more of chamber pressure, flow rate, dose time, and temperature, the inhibition profile can be tuned as desired. As described above, in some embodiments, a mass transport limited regime is employed. Chamber pressure may range from 0.5 Torr to 40 Torr in some embodiments. As noted above, flow rates of the inhibition gas can depend on a size of the chamber, reaction rates, and other parameters. A flow rate can be selected in such a way that more inhibition material is concentrated near the opening than inside the feature. In certain embodiments, these flow rates cause mass-transport limited selective inhibition.

Increased pressures and decreased flow rates and dose times result in more non-conformal (i.e., more selective to the feature opening) inhibition profile. Higher pressures result in lower mean free path, while lower flow rates and dose times limit the amount of molecules to be consumed. Increased temperatures result in a more non-conformal inhibition profile with more inhibition molecules consumed at the top of the feature. The profile may be tuned as described above depending on if and were a pinch point is in a feature. Example dose times range from 0.5 second to 10 seconds.

In some embodiments, inhibition can involve a chemical reaction between the thermal inhibitor species and the feature surface to form a thin layer of WN compound material. In some embodiments, inhibition can involve a surface effect such as adsorption that passivates the surface without forming a layer of a compound material.

If a metal nucleation layer is present, it may be exposed to $NH_3$ or other inhibition vapor to inhibit the feature. In some embodiments, if a bulk tungsten or tungsten-containing layer is present, a reducing agent/tungsten-containing precursor/nitrogen-containing inhibition chemistry may be employed to form WN on the bulk layer. These reactants may be introduced in sequence (e.g., $B_2H_6$/$WF_6$/$NH_3$ pulses) or simultaneously. Any appropriate reducing agent (e.g., diborane or silane) and any appropriate tungsten-containing precursor (e.g., tungsten hexafluoride or tungsten hexacarbonyl) may be used. A thermal process may be used to avoid damage that may arise from the use of a plasma.

In the methods described herein, inhibition profile may be controlled by temperature and/or flow rates of the inhibition gas. The higher temperatures used for deposition of low stress film can result in more inhibition species being consumed at the top of the feature. For deeper inhibition (such as used in the inhibition operations of the early cycles), higher flow rates may be used. Flow rates of the inhibition gas can depend on a size of the chamber, reaction rates, and other parameters. A flow rate can be selected in such a way that more inhibition material is concentrated near the opening than inside the feature. Exposure time can also be selected to result in a particular inhibition profile. Example exposure times can range from about 10 s to 500 s, depending on desired selectivity and feature depth. The flow rate and/or exposure time may be decreased with successive cycles to result in shallower inhibition.

Apparatus

Any suitable chamber may be used to implement the disclosed embodiments. Example deposition apparatuses include various systems, e.g., ALTUS® and ALTUS® Max, available from Lam Research Corp., of Fremont, California, or any of a variety of other commercially available processing systems.

Figure 4:
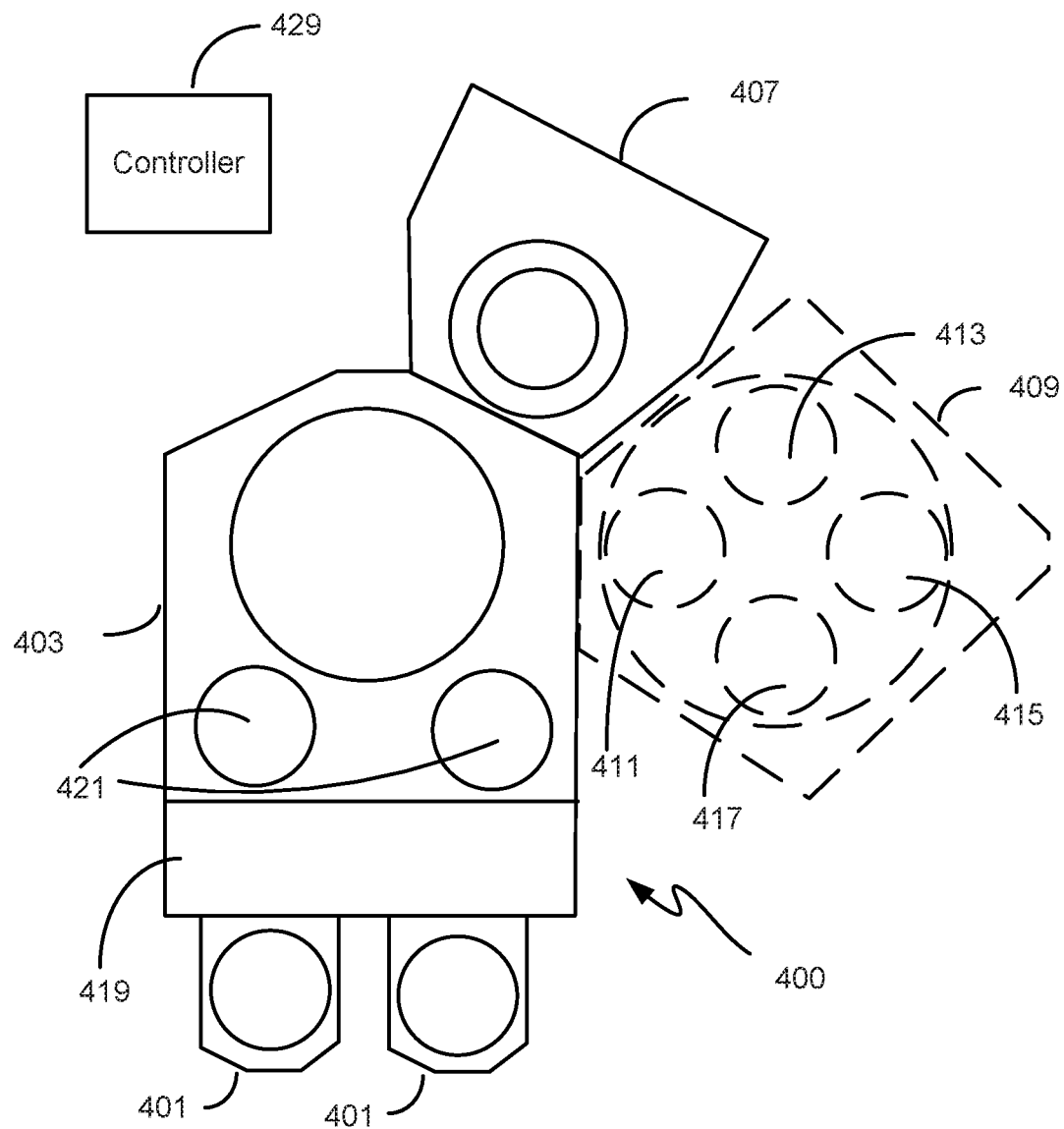
FIG. 4 is a block diagram of a processing system suitable for conducting deposition processes in accordance with embodiments described herein.

FIG. 4 is a block diagram of a processing system suitable for conducting deposition processes in accordance with embodiments. The system 400 includes a transfer module 403. The transfer module 403 provides a clean, pressurized environment to minimize risk of contamination of substrates being processed as they are moved between various reactor modules. Mounted on the transfer module 403 is a multi-station reactor 409 capable of performing ALD and CVD and inhibition processes according to embodiments. Multi-station reactor 409 may include multiple stations 411, 413, 415, and 417 that may sequentially perform operations in accordance with disclosed embodiments. For example, multi-station reactor 409 could be configured such that station 411 performs ALD nucleation and inhibition, stations 413 and 415 each perform multiple CVD and inhibition cycles, and station 417 performs CVD. In another example, multi-station reactor 409 is configured such that station 411 performs ALD nucleation, station 413 performs inhibition, station 415 performs ALD or CVD deposition, and station 417 performs CVD.

Figure 5:
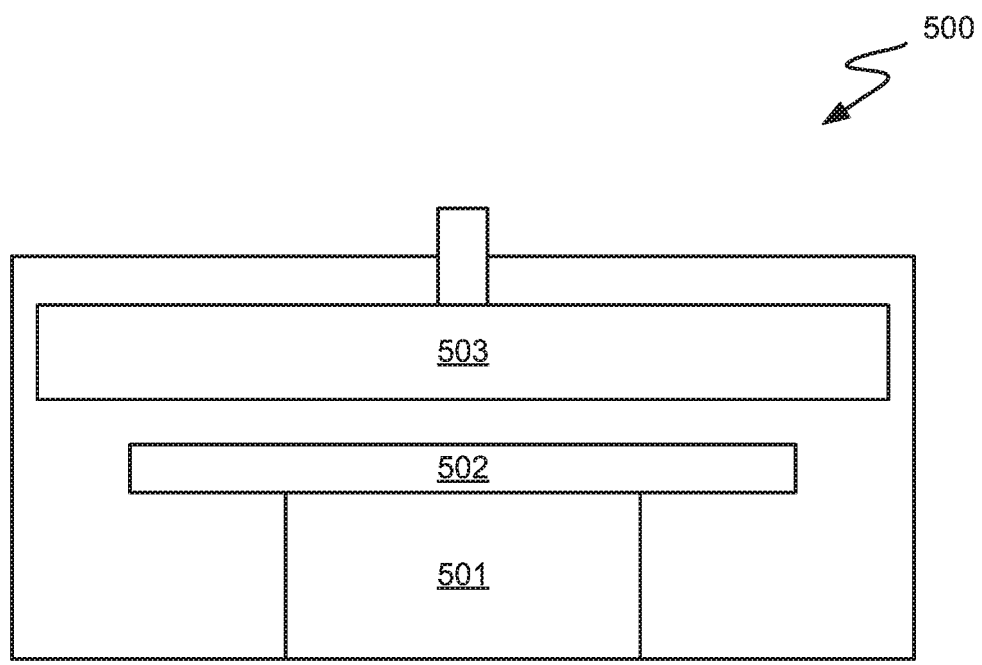
FIG. 5 is a diagram of a station suitable for conducting inhibition and deposition processes in accordance with embodiments described herein.

Stations may include a heated pedestal or substrate support, one or more gas inlets or showerhead or dispersion plate. An example of a deposition station 500 is depicted in FIG. 5, including substrate support 502 and showerhead 503. A heater may be provided in pedestal portion 501. The pedestal 501 may include a chuck for clamping the wafer. In certain embodiments, an electrostatic or mechanical chuck may be used rather than a vacuum chuck to facilitate providing a low pressure environment. Gases may be exhausted out of deposition station 500 by an exhaust (not shown).

Also mounted on the transfer module 403 may be one or more single or multi-station modules 407 capable of performing plasma or chemical (non-plasma) pre-cleans. The module may also be used for various treatments to, for example, prepare a substrate for a deposition process. The system 400 also includes one or more wafer source modules 401, where wafers are stored before and after processing. An atmospheric robot (not shown) in the atmospheric transfer chamber 419 may first remove wafers from the source modules 401 to loadlocks 421. A wafer transfer device (generally a robot arm unit) in the transfer module 403 moves the wafers from loadlocks 421 to and among the modules mounted on the transfer module 403.

In various embodiments, a system controller 429 is employed to control process conditions during deposition. The controller 429 will typically include one or more memory devices and one or more processors. A processor may include a CPU or computer, analog and/or digital input/output connections, stepper motor controller boards, etc.

The controller 429 may control all of the activities of the deposition apparatus. The system controller 429 executes system control software, including sets of instructions for controlling the timing, mixture of gases, chamber pressure, chamber temperature, wafer temperature, wafer chuck or pedestal position, and other parameters of a particular process. Other computer programs stored on memory devices associated with the controller 429 may be employed in some embodiments.

Typically there will be a user interface associated with the controller 429. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language.

The computer program code for controlling the germanium-containing reducing agent pulses, hydrogen flow, and tungsten-containing precursor pulses, and other processes in a process sequence can be written in any conventional computer readable programming language: for example, assembly language, C, C++, Pascal, Fortran, or others. Compiled object code or script is executed by the processor to perform the tasks identified in the program. Also as indicated, the program code may be hard coded.

The controller parameters relate to process conditions, such as, for example, process gas composition and flow rates, temperature, pressure, cooling gas pressure, substrate temperature, and chamber wall temperature. These parameters are provided to the user in the form of a recipe, and may be entered utilizing the user interface.

Signals for monitoring the process may be provided by analog and/or digital input connections of the system controller 429. The signals for controlling the process are output on the analog and digital output connections of the system 400.

The system software may be designed or configured in many different ways. For example, various chamber component subroutines or control objects may be written to control operation of the chamber components necessary to carry out the deposition processes in accordance with the disclosed embodiments. Examples of programs or sections of programs for this purpose include substrate positioning code, process gas control code, pressure control code, and heater control code.

In some implementations, a controller 429 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 429, depending on the processing requirements and/or the type of system, may be programmed to control any of the processes disclosed herein, including the delivery of processing gases, temperature settings (e.g., heating and/or cooling), pressure settings, vacuum settings, power settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 429, in some implementations, may be a part of or coupled to a computer that is integrated with, coupled to the system, otherwise networked to the system, or a combination thereof. For example, the controller 429 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a PVD chamber or module, a CVD chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The controller 429 may include various programs. A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition, flow rates, pulse times, and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition include mass flow controllers, pressure sensors such as manometers, and thermocouples located in the pedestal or chuck. Appropriately programmed feedback and control algorithms may be used with data from these sensors to maintain desired process conditions.

The foregoing describes implementation of disclosed embodiments in a single or multi-chamber semiconductor processing tool. The apparatus and process described herein may be used in conjunction with lithographic patterning tools or processes, for example, for the fabrication or manufacture of semiconductor devices, displays, LEDs, photovoltaic panels, and the like. Typically, though not necessarily, such tools/processes will be used or conducted together in a common fabrication facility. Lithographic patterning of a film typically comprises some or all of the following steps, each step provided with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

The invention claimed is:

1. A method comprising:
    providing a 3-D structure on a substrate, the 3-D structure comprising metal lines arranged in a staircase pattern, a dielectric material overlying the staircase pattern, and a vertically-oriented feature having feature sidewalls and a feature bottom and providing fluidic access to a metal line at the feature bottom;
    depositing a conformal layer of metal in the vertically-oriented feature;
    exposing the conformal layer of metal to inhibition species at a first flow rate and a first exposure time in a first inhibition operation;
    after the first inhibition operation, preferentially depositing metal at the bottom of the vertically-oriented feature in a first non-conformal deposition operation, wherein a temperature of the substrate is at least 400° C. during the first non-conformal deposition operation;
    after the first non-conformal deposition operation, exposing the vertically-oriented feature to inhibition species at a second flow rate and a second exposure time in a second inhibition operation, wherein the second flow rate is lower than the first flow rate and/or the second exposure time is lower than the first exposure time;
    and after the second inhibition operation, depositing metal in the feature at a substrate temperature of at least 400° C. in a second non-conformal deposition operation.

2. The method of claim 1, wherein the metal is one of tungsten, cobalt, molybdenum, and ruthenium.

3. The method of claim 1, wherein preferentially depositing metal at the bottom of the feature comprises exposing the feature to a metal precursor and a reducing agent, wherein the volumetric ratio of reducing agent to metal precursor is at least 30:1.

4. The method of claim 1, wherein preferentially depositing metal at the bottom of the feature comprises exposing the feature to a metal precursor at flow rate of no more than 100 sccm.

5. The method of claim 1, wherein the feature is an interconnect feature in a 3D NAND device.

6. The method of claim 1, wherein the metal is tungsten and the substrate temperature is at least 430° C. during deposition.

7. The method of claim 1, wherein the metal is molybdenum and the substrate temperature is at least 600° C. during deposition.

8. The method of claim 1 wherein the inhibition species are nitrogen-containing gas or plasma species.

9. The method of claim 1, wherein the first inhibition operation treats most of the feature.

10. The method of claim 1, wherein the first inhibition operation treats at least 70% of the feature depth.

11. The method claim 1, wherein a substrate temperature during the first inhibition operation is different than during the second inhibition operation.

12. An apparatus for processing substrates, the apparatus comprising:
    (a) a process chamber comprising at least one station having a pedestal configured to hold a substrate;
    (b) at least one outlet for coupling to a vacuum;
    (c) one or more process gas inlets coupled to one or more process gas sources; and
    (d) a controller for controlling operations in the apparatus, comprising machine-readable instructions for:
        inletting inhibition species at first flow rate and first exposure time to the process chamber in a first inhibition operation;

after the first inhibition operation, inletting a metal precursor and reducing agent to deposit a metal, wherein a temperature of the pedestal on which the substrate is at least 400° C., in a first non-conformal deposition operation;

after the first non-conformal deposition operation, inletting inhibition species to the process chamber at a second flow rate and second exposure time in a second inhibition operation, wherein the second flow rate is lower than the first flow rate and/or the second exposure time is lower than the first exposure time; and after the second inhibition operation, inletting a metal precursor and reducing agent to deposit a metal, wherein a temperature of the pedestal on which the substrate is at least 400° C., in a second non-conformal deposition operation.

13. The apparatus of claim 12, wherein the volumetric ratio of reducing agent to tungsten precursor is at least 30:1 during the first and second non-conformal deposition operations.

14. A method comprising:
depositing a conformal layer of metal in a feature on a substrate;
treating a portion of the conformal layer of metal to inhibit subsequent tungsten nucleation;
after treating the portion of the conformal layer, preferentially depositing tungsten at the bottom of the feature, wherein a temperature of the substrate is at least 400° C. during the deposition; and
repeating the treating and depositing operations one or more times to fill the feature with metal.

15. The method of claim 14, wherein the metal is one of tungsten, cobalt, molybdenum, and ruthenium.

16. The method of claim 14, wherein preferentially depositing metal at the bottom of the feature comprises exposing the feature to a metal precursor and a reducing agent, wherein the volumetric ratio of reducing agent to metal precursor is at least 30:1.

17. The method of claim 14, wherein preferentially depositing metal at the bottom of the feature comprises exposing the feature to a metal precursor at flow rate of no more than 100 sccm.

18. The method of claim 14, wherein the feature is an interconnect feature in a 3D-NAND device.

19. The method of claim 14, wherein the metal is tungsten and the substrate temperature is at least 430° C. during deposition.

20. The method of claim 14, wherein the metal is molybdenum and the substrate temperature is at least 600° C. during deposition.

* * * * *